United States Patent [19]

Iio

[11] Patent Number: 4,712,152

[45] Date of Patent: Dec. 8, 1987

[54] SEMICONDUCTOR INTEGRATED CIRCUIT DEVICE

[75] Inventor: Masaya Iio, Itami, Japan

[73] Assignee: Mitsubishi Denki Kabushiki Kaisha, Tokyo, Japan

[21] Appl. No.: 941,048

[22] Filed: Dec. 12, 1986

[30] Foreign Application Priority Data

Dec. 12, 1985 [JP] Japan .................................. 60-280092

[51] Int. Cl.⁴ ........................ H02H 9/00; H01L 27/04
[52] U.S. Cl. ........................................ 361/56; 361/91; 361/111; 361/100; 361/118; 357/13; 357/48; 357/50; 357/23.13; 357/46; 330/207 P; 330/298
[58] Field of Search .................... 357/23.13, 35, 13, 50, 357/46, 48; 307/200 A; 361/56, 91, , 111, 100, 101, 118, 119; 330/207 P, 298

[56] References Cited

U.S. PATENT DOCUMENTS

| | | | |
|---|---|---|---|
| 4,131,908 | 12/1978 | Daub et al. | 357/42 |
| 4,405,933 | 9/1983 | Avery | 357/13 |
| 4,498,227 | 4/1985 | Howell et al. | 357/50 |
| 4,527,213 | 7/1985 | Ariizumi | 357/23.13 |
| 4,656,491 | 4/1987 | Igarashi | 357/23.13 |

FOREIGN PATENT DOCUMENTS 0113282 9/1979 Japan .............................. 357/13 LM

OTHER PUBLICATIONS

"Advanced Schottky Family", Application Report Texas Instruments, printed in Japan '84, 11, p. 7.

*Primary Examiner*—William D. Larkins
*Assistant Examiner*—D. Featherstone
*Attorney, Agent, or Firm*—Birch, Stewart, Kolasch & Birch

[57] ABSTRACT

A semiconductor integrated circuit device comprising: at least two NPN transistors whose bases and emitters are connected to the ground and whose collectors are connected to an input terminal; one of said NPN transistors having a lower breakdown starting voltage and a higher breakdown maintaining voltage than those of the other of said NPN transistors; and an input portion which has a breakdown maintaining voltage at a high surge voltage breakdown which occurs caused by an application of a high surge voltage input to said input terminal which is lower than that at a low input voltage breakdown which occurs caused by an application of a low surge voltage or an input voltage which rises up gradually.

3 Claims, 7 Drawing Figures

F I G .6.
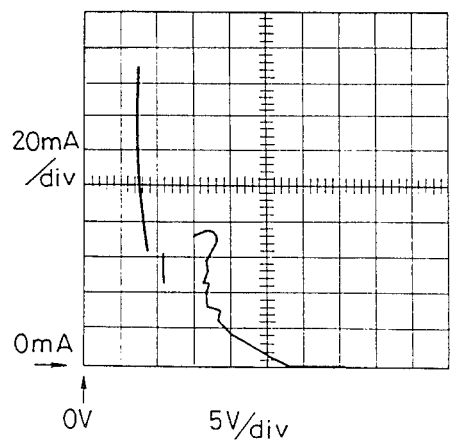
F I G .7.
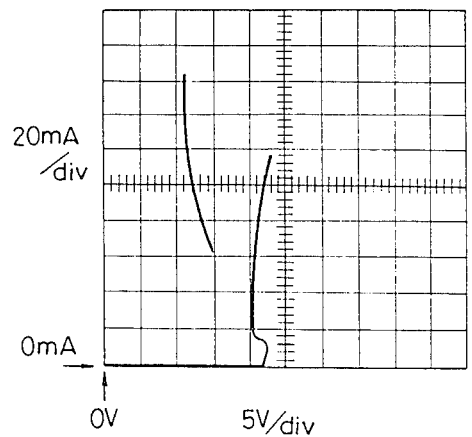

SEMICONDUCTOR INTEGRATED CIRCUIT DEVICE

FIELD OF THE INVENTION

The present invention relates to a semiconductor integrated circuit device, and more particularly to the enhancement of the surge resistivity of the input terminal thereof.

BACKGROUND ART

FIG. 3 shows a circuit diagram of an input portion of ASOO NAND Gate Schematic shown in page 7 of Advanced Schottky Family Application Report of Texas Instruments Corporation. In FIG. 3, the reference numeral 1 designates an input terminal, the reference numeral 2 designates a PNP transistor, the reference numeral 3 designates an input schottky barrier diode (hereinafter referred to as "SBD"), the reference numeral 4 designates an input clamping SBD, and the reference numeral 5 designates an NPN transistor for increasing the surge resistivity.

FIG. 4 is a circuit diagram showing the portion relating to the surge resistivity extracted from the circuit of FIG. 3, and FIG. 5 is a cross-sectional view showing the IC structure for realizing the circuit of FIG. 4. In the FIGS. 4 and 5, the reference numeral 6 designates an N type epitaxial layer, and this is used as the collector of the NPN transistor 5. The reference numerals 7 and 8 designate P+ and N+ layer produced on the surface of the epitaxial layer 6, respectively, and they are used as the base and the emitter of the NPN transistor 5. The reference numeral 9 designates an aluminum wiring connected to the internal circuit of the IC. The reference numeral 10 designates an aluminum wiring of the ground level. The reference numeral 11 designates an N+ layer provided so as to reduce the resistance component between the input terminal 1 and the collector 6. The reference numeral 12 designates an N+ layer provided so as to reduce the resistance component between the N+ layer 11 and the collector 6. The reference numeral 13 designates an N+ embedded layer of the ground level provided so as to prevent the operation of the parasitic element. The reference numeral 14 designates a P+ layer of the ground level provided to prevent the current leakage between the N+ embedded layers 12 and 13. The reference numeral 15 designates a P type substrate, and the reference numeral 16 designates an oxide film provided to separate the epitaxial layer 6 and the other epitaxial layer (not shown). The reference numeral 17 designates an oxide film provided to protect the surface of the epitaxial layer 6. FIG. 6 shows the at breakdown voltage vs current characteristics (base-emitter short characteristics) of the NPN transistor 5.

The operation of the device when the surge voltage is applied will be described.

When a surge voltage is applied to the input terminal 1, if there is not provided an NPN transistor 5, an overcurrent flows through the input SBD 3, and a large power is consumed at the input SBD 3 because the breakdown voltage of the input SBD 3 is relatively high, that is, about 30 V, and the input SBD 3 is easily destroyed. Actually, there is an NPN transistor which shows the characteristics of FIG. 6, and when a surge voltage is applied the NPN transistor 5 enters the breakdown state, and an overcurrent does not flow through the input SBD 3. Then, the transistor 5 shows a low breakdown maintaining voltage of about 7 V, and this voltage is sufficiently low with relative to the breakdown voltage of the input SBD 3, and a large portion of the surge current flows through the NPN transistor 5.

By the way, in the transistor 5 the voltage drop at the junction portion is small and the power concentration on the junction portion is small, and the area of the junction portion is enlarged to a value larger than that of the input SBD 3, thereby reducing the power consumption per a unit area. Accordingly, even if a large current flows through the NPN transistor 5, the NPN transistor 5 is not likely to be destroyed with relative to the input SBD 3, and thus it is possible to enhance the anti input surge distraction resistivity to a great extent by using the NPN transistor 5.

The input portion of the prior art semiconductor integrated circuit device is constructed in such a manner, and the input portion has a breakdown maintaining voltage of about 7 V, but in a device having this characteristics there is a possibility that this characteristics does not satisfy the regulation that the input voltage resistivity is 7 V depending on the way of use. That is to say, it is expected that a variation of about 1 V exists in the breakdown maintaining voltage, and when it is supposed that the prior art devices are produced, there may be produced a lot of devices having an input portion which has a breakdown maintaining voltage less than 7 V. Furthermore, when an input voltage larger than 35 V is applied temporarily in such a prior art device, a large current flows continuously even if the input voltage is reduced to 7 V. Although it cannot be necessarily said that such a device is out of regulation, it is quite undesirable.

SUMMARY OF THE INVENTION

It is an object of the present invention to provide an improved semiconductor integrated circuit device having an input portion which has a high anti surge resistivity and a sufficiently high breakdown maintaining voltage.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, there is provided a semiconductor integrated circuit device comprising: at least two NPN transistors whose bases and emitters are connected to the ground and whose collectors are connected to an input terminal; one of said NPN transistors having a lower breakdown starting voltage and a higher breakdown maintaining voltage than those of the other of said NPN transistors; and an input portion which has a breakdown maintaining voltage at a high surge voltage breakdown which occurs caused by an application of a high surge voltage input to said input terminal which is lower than that at a low input voltage breakdown which occurs caused by an application of a low surge voltage or an input voltage which rises up gradually.

BRIEF DESCRIPTION OF THE DRAWINGS

FIG. 6 is a diagram showing the at breakdown voltage vs current characteristics (base-emitter short characteristics) of the NPN transistor for enhancing the surge resistivity; and FIG. 7 is a diagram showing the at breakdown voltage vs current characteristics (base-emitter short characteristics) of the NPN transistor for enhancing the input breakdown maintaining voltage.

DETAILED DESCRIPTION OF THE PREFERRED EMBODIMENTS

Figure 1:
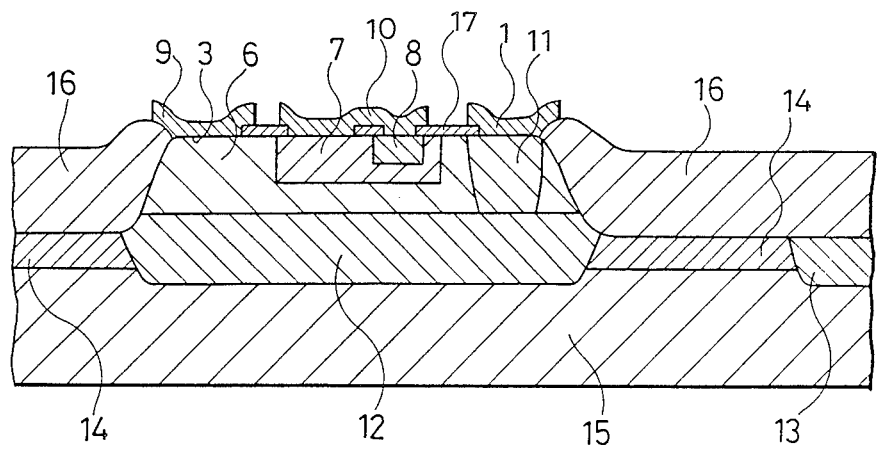
FIG. 1 is a cross-sectional view showing the input portion of a semiconductor integrated circuit device as an embodiment of the present invention.
Figure 2:
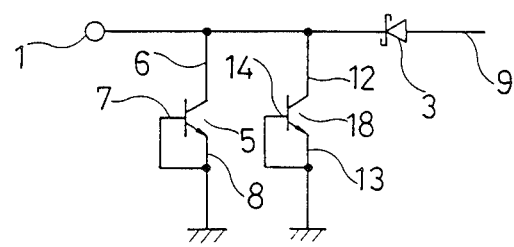
FIG. 2 is a circuit diagram showing the input portion of the device of FIG. 1.
Figure 3:
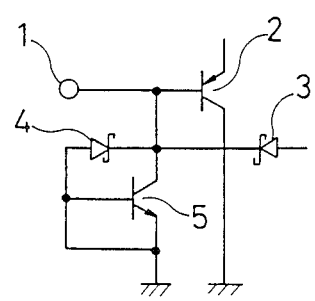
FIG. 3 is a circuit diagram showing the input portion of a prior art semiconductor integrated circuit device.

In order to explain the present invention in detail, reference will be particularly made to FIGS. 1 and 2.

Figure 4:
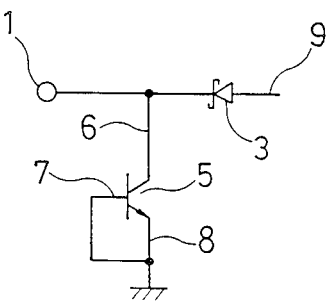
FIG. 4 is a circuit diagram showing a portion relating to the surge resistivity which portion is extracted from the circuit of FIG. 3.
Figure 5:
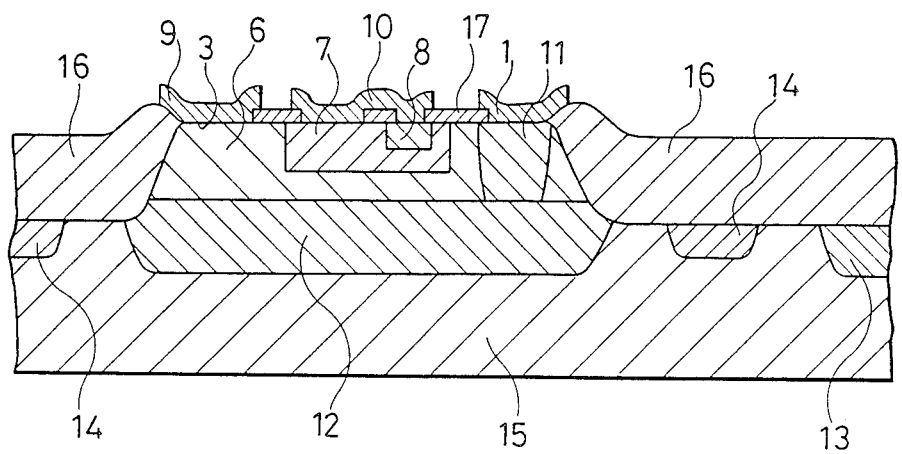
FIG. 5 is a cross-sectional view showing the input portion which realizes the circuit of FIG. 4.

FIG. 1 shows a cross-sectional view of the input portion of a semiconductor integrated circuit device as an embodiment of the present invention, and FIG. 2 shows the circuit of the input portion of the device. In both Figures the reference numerals 1, 3, 5 to 11, 15 to 17 designate the same elements as those shown in FIGS. 4 and 5. The reference character 18 designates an NPN transistor newly added in this embodiment. The resistance component of the NPN transistor 18 is larger than the resistance component of the NPN transistor 5. The reference numeral 14 designates a P+ layer used as a base of the transistor 18. The reference numerals 12 and 13 designate N type embedded layers used as the collector and emitter of the transistor 18, respectively.

FIG. 7 shows the at breakdown voltage vs current characteristics (base-emitter short characteristics) of the PNP transistor 18.

The operation of the device when a high voltage is applied to the input terminal will be described.

At first, when a surge voltage of about 30 to 50 V or a voltage which relatively gradually rises up is applied to the input terminal 1, the NPN transistor 18 is broken down at the timing when the voltage of the input terminal becomes 20 to 25 V, thereby lowering the input voltage to 10 to 15 V. Then, the NPN transistor 5 is not broken down because it has a breakdown starting voltage of about 35 V. Thereafter, when the input voltage is lowered to a value below 10 V, the NPN transistor 18 enters a state incapable of maintaining the breakdown state, and restores to the cut off state.

Next, the operation when a high surge voltage is applied is considered. In this case, the rising up of the input voltage is extremely fast, and the input voltage exceeds transitorily 35 V before the NPN transistor 18 lowers the input voltage by the breakdown of the transistor 18. By this, both of the NPN transistors 5 and 18 are broken down, and a large portion of the surge current flows through the NPN transistor 5 and the NPN transistor 18 restores to the cut off state soon because the NPN transistor 5 has a lower breakdown maintaining voltage than that of the NPN transistor 18 and the resistance component of the NPN transistor 18 is larger than that of the NPN transistor 5.

In this embodiment at the input portion a high surge resistivity is obtained by the NPN transistor 5 as similarly as in the prior art device, and furthermore the input portion is broken down at a relatively low voltage by a surge voltage of about 30 to 50 V or a relatively gradually rising voltage, and the device can be restored to a cut off state by a relatively high voltage.

As is evident from the foregoing description, according to the present invention, an NPN transistor having a low breakdown starting voltage and a high breakdown maintaining voltage with relative to an NPN transistor provided for enhancing the surge resistivity is connected to an input terminal together with the NPN transistor in parallel with each other, whereby a semiconductor integrated circuit device having an input portion which has a high surge resistivity and a sufficiently high breakdown maintaining voltage is obtained.

What is claimed is:

1. A semiconductor integrated circuit device comprising:

at least two NPN transistors whose bases and emitters are connected to the ground and whose collectors are connected to an input terminal;

one of said NPN transistors having a lower breakdown starting voltage and a higher breakdown maintaining voltage than those of the other of said NPN transistors; and an input portion which has a breakdown maintaining voltage at a high surge voltage breakdown which occurs due to an application of a high surge voltage input to said input terminal which is lower than that at a low input voltage breakdown which occurs due to an application of a low surge voltage or an input voltage which rises up gradually.

2. A semiconductor integrated circuit device as defined in claim 1, wherein a resistance component serially connected to said NPN transistor having a higher breakdown maintaining voltage is larger than the resistance of said NPN transistor having a lower breakdown maintaining voltage.

3. A semiconductor integrated circuit device as defined in claim 1, wherein said input portion has a P type semiconductor substrate, a plurality of N type embedded layers produced on said substrate apart from each other, an N type epitaxial layer produced on said N type embedded layers, an oxide film produced on said semiconductor substrate to separate said epitaxial layers from each other, P layers produced on said semiconductor substrate directly below said oxide film to have a higher impurity density than that of said semiconductor substrate, P layers produced in said epitaxial layers, and N layers produced in said P layers, and said N type epitaxial layers are used as the collector of said lower breakdown maintaining voltage NPN transistor at the input portion, said P layer in said epitaxial layer and said N layer in said P layer are used as the base and the emitter thereof, respectively, said P layers produced in said semiconductor substrate direct below said oxide film is used as the base of said higher breakdown maintaining voltage NPN transistor, and said N type embedded layers at the both sides of said P layer is used as the emitter and the collector thereof, respectively.

* * * * *